(12) United States Patent
Lin

(10) Patent No.: US 6,316,341 B1
(45) Date of Patent: Nov. 13, 2001

(54) METHOD FOR CELL PASS TRANSISTOR DESIGN IN DRAM PROCESS

(75) Inventor: Kun-Chi Lin, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/510,971

(22) Filed: Feb. 21, 2000

(51) Int. Cl.[7] .......................... H01L 21/22; H01L 21/425; H01L 21/336

(52) U.S. Cl. .......................... 438/546; 438/289; 438/291; 438/532

(58) Field of Search .................................... 438/289, 290, 438/291, 527, 529, 532, 546

(56) References Cited

U.S. PATENT DOCUMENTS

| | | | |
|---|---|---|---|
| 5,436,176 | * 7/1995 | Shimizu et al. | 438/526 |
| 5,554,553 | * 9/1996 | Harari | 438/264 |
| 5,830,789 | * 10/1999 | Aronowitz et al. | 438/217 |
| 5,930,615 | * 7/1999 | Manning | 438/232 |
| 5,943,595 | * 8/1999 | Akiyama et al. | 438/527 |
| 5,963,801 | * 11/1998 | Lien et al. | 438/217 |
| 6,184,151 | * 2/2001 | Adair et al. | 438/743 |
| 6,232,166 | * 5/2001 | Ju et al. | 438/231 |
| 6,235,599 | * 5/2001 | Yu | 438/305 |
| 6,245,592 | * 6/2001 | Yang | 438/79 |

* cited by examiner

Primary Examiner—Matthew Smith
Assistant Examiner—Chuong Luu

(57) ABSTRACT

A method for forming a cell passes transistor in DRAM process disclosed. In one embodiment, the present invention provides a MOS structure, which can reduce junction leakage for P/N junction and increase the refreshes time capability. A method for DRAM fabrication comprises providing a semiconductor substrate having at least an isolation device therein. The isolation device defines an active area adjacent thereto on the semiconductor substrate. A first photoresist layer is formed on the semiconductor substrate, which exposes the active area in a first direction. The first conductive ions are implanted to form a well region in the semiconductor substrate, and the second conductive ions are implanted to form a field implant region in the semiconductor substrate. The third conductive ions are implanted to form a punchthrough implant region in the semiconductor substrate. Then the first photoresist layer is removed, and a second photoresist layer is formed on the semiconductor substrate. The second photoresist layer exposes the active area in a second direction different from the first direction. The fourth conductive ions are implanted to form a threshold implant region, and then the second photoresist layer is removed.

10 Claims, 2 Drawing Sheets

METHOD FOR CELL PASS TRANSISTOR DESIGN IN DRAM PROCESS

BACKGROUND OF THE INVENTION

1. Field of the Invention

The present invention relates to a method for DRAM fabrication, and more particularly, to the cell pass transistor design in DRAM fabrication.

2. Description of the Prior Art

As circuitry density continues to increase, there is a corresponding drive to produce smaller and smaller field effect transistors. Field effect transistors have typically been formed by providing active areas within a bulk substrate material or within a complementary conductivity type well formed within a bulk substrate. One recent technique finding greater application in achieving reduced transistor size is to form field transistors with thin films, which are commonly referred to as "thin film transistor" (TFT) technology.

FIG. 1A shows a top view in the fabrication of a conventional MOS structure, and FIGURE 1B shows a flowchart in the fabrication of the conventional MOS structure. Conventionally, a resist layer is patterned and first P-type ions are then implanted to form a well implantation region in the silicon substrate 100. Moreover, second P-type ions are implanted to form a field implantation region in the silicon substrate 100. Consequentially, third P-type ions are implanted to form a punchthrough implantation region in the silicon substrate 100. Finally, fourth P-type ions 110 are implanted to form a threshold implantation region in the silicon substrate 100. The threshold implantation region is formed to implant a dosage between about 1.0 E 13–1.0 E 18 atoms/cm$^2$. Finally, the resist layer is removed. When DRAM technology enters 0.18 $\mu$m and below, the substrate convention of the cell pass transistor substrate concentration (Nsub) must increase as high as 1.0 E 18 to control cell transistor short channel effect. But this high cell pass transistor substrate concentration (Nsub) will induce more junction leakage for P/N junction, decreasing the refresh time capability.

SUMMARY OF THE INVENTION

In accordance with the present invention, a method is provided for fabricating a cell pass transistor for a DRAM. Therefore, short channel effect of cell transistor can be under adequate control. Furthermore, junction leakage can be reduced for P/N junction of bit-line contact and storage node area. In addition, the refresh time capability of the DRAM can be increased.

In one embodiment, the present invention provides a MOS structure, which can reduce junction leakage for P/N junction and increase the refresh time capability. A method for DRAM fabrication comprises providing a semiconductor substrate having at least an isolation device therein. The isolation device defines an active area adjacent thereto on the semiconductor substrate. A first photoresist layer is formed on the semiconductor substrate, which exposes the active area in a first direction. The first conductive ions are implanted to form a well region in the semiconductor substrate, and the second conductive ions are implanted to form a field implant region in the semiconductor substrate. The third conductive ions are implanted to form a punchthrough implant region in the semiconductor substrate. Then the first photoresist layer is removed, and a second photoresist layer is formed on the semiconductor substrate. The second photoresist layer exposes the active area in a second direction different from the first direction. The fourth conductive ions are implanted to form a threshold implant region, and then the second photoresist layer is removed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
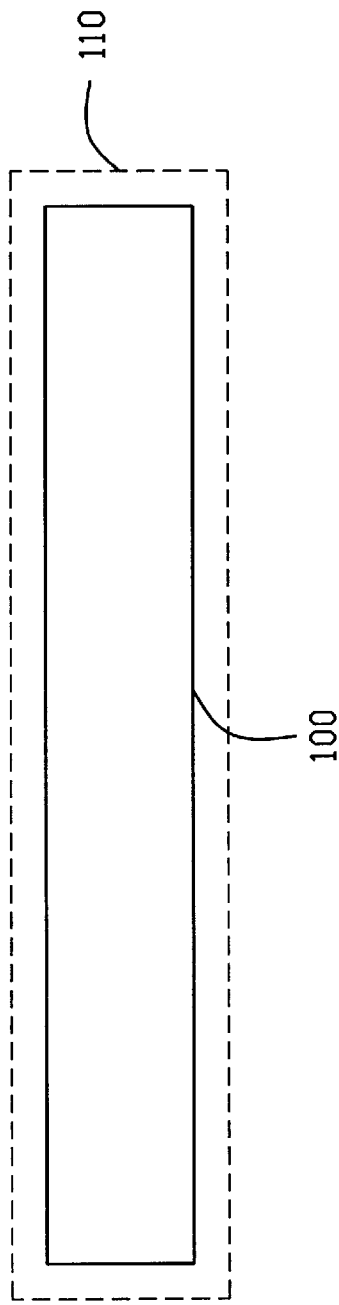
FIG. 1A shows a top view in the fabrication of a conventional MOS structure.
Figure 1B:
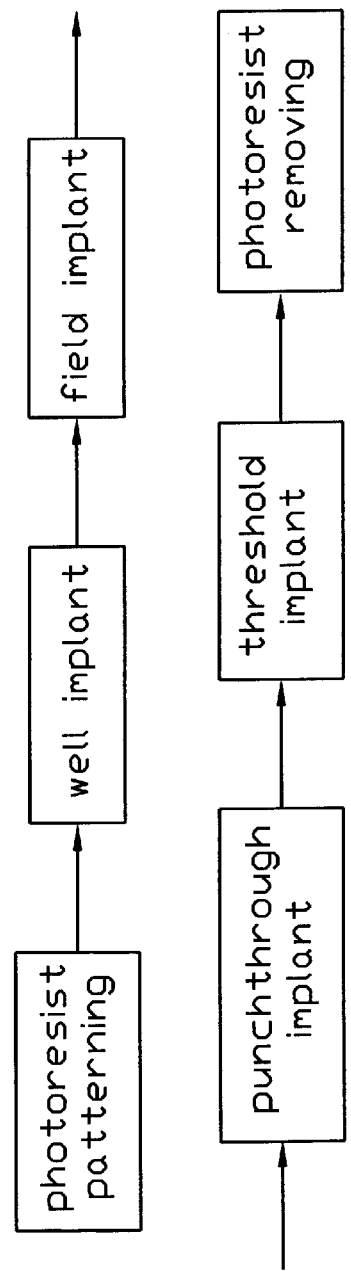
FIG. 1B shows a flowchart in the fabrication of a conventional MOS structure.
Figure 2A:
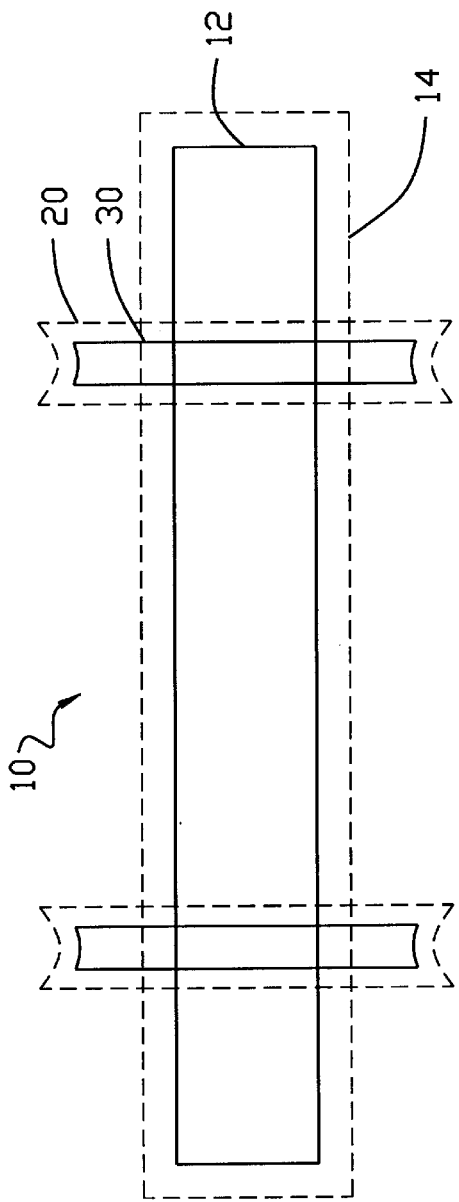
FIG. 2A shows a top view in the fabrication of a MOS structure in accordance with one embodiment of the present invention.
Figure 2B:
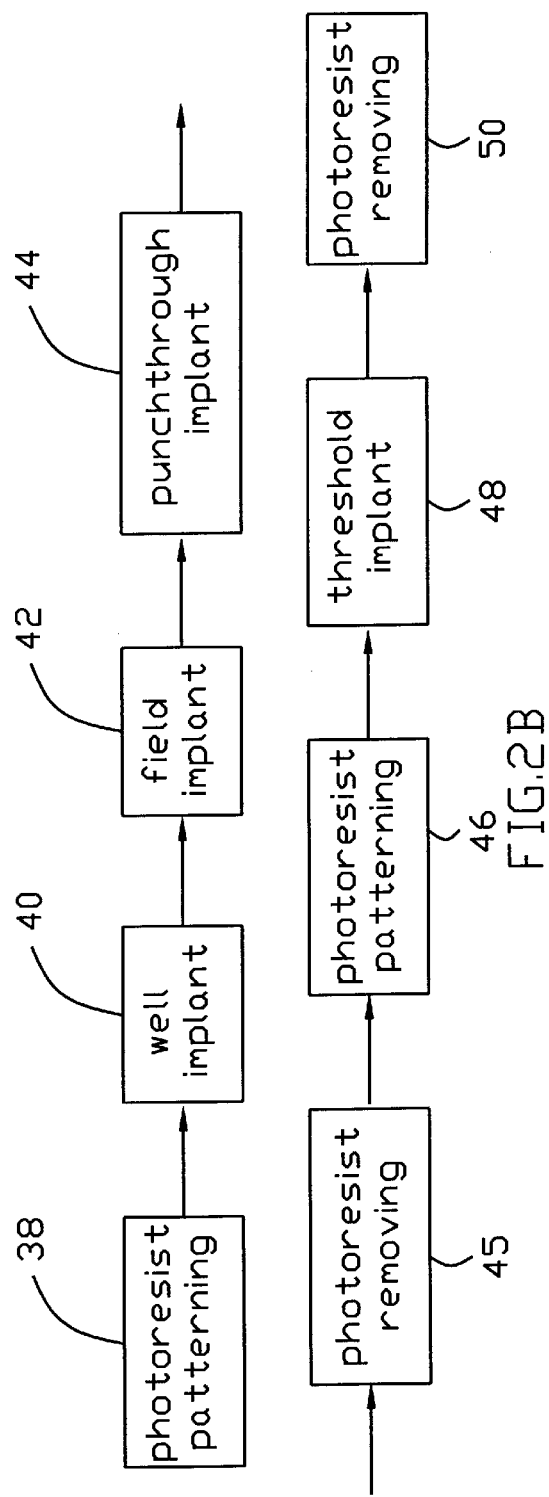
FIG. 2B shows a flowchart in the fabrication of a MOS structure in accordance with one embodiment of the present invention.

FIG. 2A shows a top view, and FIG. 2B shows a flowchart for the fabrication of a MOS structure in accordance with one embodiment of the present invention. A silicon substrate 10 with p-type conductivity is firstly provided. A pad oxide of about 100–300 angstroms abuts above the substrate 10 by traditional oxide technique. Next, a silicon nitride layer is formed on the pad oxide with a thickness of about 1500–2500 angstroms. Using a photoresist layer as a mask above the silicon nitride by conventional photolithography techniques silicon substrate 10 is then isotropically etched to form a plurality of shallow trenches inside the silicon substrate 10, wherein the shallow trenches define an active area 12 adjacent thereto on the silicon substrate 10. And then the photoresist layer is removed. Moreover, a first silicon dioxide layer is deposited over the substrate 10 and within the trenches, generally followed by a planarization process such as chemical mechanical polishing (CMP). The silicon dioxide is polished to stop on the silicon nitride. Consequentially, the silicon nitride and the pad oxide layer are removed.

A first photoresist layer is patterned (step 38) to define a well region 14. The first photoresist layer exposes the active area 12 in a first direction in which the coming word-line device, such as a storage node, formed. First P-type ions are implanted (step 40) to form the well implantation region 14 in the silicon substrate 10. The well implantation uses boron (B) as an ion source, at energy between about 250 KeV to 400 KeV, to implant a dosage about between 1.0 E 13–1.0 E 18 atoms/cm$^2$. Moreover, second P-type ions are implanted (step 42) to form a field implantation region. The field implantation uses boron (B) as an ion source, at an energy between about 100 KeV to 200 KeV, to implant a dosage about between 1.0 E 12–1.0 E 17 atoms/cm$^2$. Consequentially, third P-type ions are implanted (step 44) to form a punchthrough implantation region. The punchthrough implantation uses boron (B) as an ion source, at an energy between about 50 KeV to 80 KeV, to implant a dosage between about 1.0 E 12–1.0 E 17 atoms/cm$^2$. Then the first photoresist layer that defined the well region is removed (step 45). When DRAM technology enters 0.18 $\mu$m and below, the substrate concentration of cell pass transistor (Nsub) must increase as high as 1.0 E 18 to control cell transistor short channel effect. This high substrate concentration (Nsub), however, will induce more junction leakage, decreasing the refresh time capability. Reverse poly1 pattern is used to replace all conventional cell area implant to reduce bit-line contact and storage node junction leakage. In the embodiment, a second patterned photoresist layer is formed (step 46) over the silicon substrate 10. The second photoresist layer exposes the active area 12 in a second direction orthogonal to the first direction, such as in the direction of the coming formation of a threshold implantation region 20. The second direction is just where the bit-line devices are formed. Fourth P-type ions are implanted (step 48) to form the threshold implantation region 20 by using the second patterned photoresist layer as an implanting mask. The threshold implantation uses boron (B) as an ion source, at a energy between about 10 KeV to 20 KeV, to implant a dosage about between 1.0 E 13–1.0 E 18 atoms/cm$^2$. To be specific, the threshold implantation isn't performed in a source/drain region that is located the outside of the gate structure 30. Thus, the dopant concentration of junction is reduced. Afterwards, the second patterned photoresist layer is removed (step 50). Subsequently, a gate structure 30 is formed over the threshold implantation region 20. Finally, a traditional semiconductor device is formed over the active region 12 of the substrate 10.

It is an object of the present invention to provide a method for DRAM fabrication. The method comprises providing a semiconductor substrate having at least an isolation device therein. The isolation device defines an active area adjacent thereto on the semiconductor substrate. A first photoresist layer is formed on the semiconductor substrate, which exposes the active area in a first direction. The first conductive ions are implanted to form a well region in the semiconductor substrate, and the second conductive ions are implanted to form a field implant region in the semiconductor substrate. The third conductive ions are implanted to form a punchthrough implant region in the semiconductor substrate. Then the first photoresist layer is removed, and a second photoresist layer is formed on the semiconductor substrate. The second photoresist layer exposes the active area in a second direction different from the first direction. The fourth conductive ions are implanted to form a threshold implant region, and then the second photoresist layer is removed.

Although specific embodiments have been illustrated and described, it will be obvious to those skilled in the art that various modifications may be made without departing from what is intended to be limited solely by the appended claims. It is an object of the present invention to provide a method for DRAM fabrication. The method comprises providing a semiconductor substrate having at least an isolation device therein. The isolation device defines an active area adjacent thereto on the semiconductor substrate. A first photoresist layer is formed on the semiconductor substrate, which exposes the active area in first direction. The first conductive ions are implanted to form a well region in the semiconductor substrate, and the second conductive ions are implanted to form a field implant region in the semiconductor substrate. The third conductive ions are implanted to form a punchthrough implant region in the semiconductor substrate. Then the first photoresist layer is removed, and a second photoresist layer is formed on the semiconductor substrate. The second photoresist layer exposes the active area in a second direction different from the first direction. The fourth conductive ions are implanted to form a threshold implant region, and then the second photoresist layer is removed.

What is claimed is:

1. A method for DRAM fabrication, comprising:

providing a semiconductor substrate having at least an isolation device therein, said isolation device defining an active area adjacent thereto on said semiconductor substrate;

forming a first photoresist layer on said semiconductor substrate, said first photoresist layer exposing said active area in a first direction;

implanting first conductive ions to form a well region in said semiconductor substrate;

implanting second conductive ions to form a field implant region in said semiconductor substrate;

implanting third conductive ions to form a punchthrough implant region in said semiconductor substrate;

removing said first photoresist layer;

forming a second photoresist layer on said semiconductor substrate, said second photoresist layer exposing said active area in a second direction different from said first direction;

implanting fourth conductive ions to form a threshold implant region; and removing said second photoresist layer.

2. The method according to claim 1, wherein said first direction is orthogonal to said second direction.

3. The method according to claim 1, wherein said second direction comprises a plurality of bit line devices formed therein.

4. The method according to claim 1, wherein said first direction comprises a plurality of word line devices formed therein.

5. The method according to claim 1, wherein said semiconductor substrate comprises a p-type substrate having a dosage of p-type ions of about 1.0E18 atom/cm$^2$.

6. The method according to claim 1, wherein all of said conductive ions comprise same type ions.

7. A method for DRAM fabrication, comprising:

providing a substrate with a conductivity, said substrate having at least an isolation device wherein defines an active area adjacent thereto on said substrate;

forming a first photoresist layer on said semiconductor substrate, said first photoresist layer exposing said active area in a first direction;

implanting first ions with said conductivity to form a well region in said substrate;

implanting second ions with said conductivity to form a field implant region in said substrate;

implanting third ions with said conductivity to form a punchthrough implant region in said substrate;

removing said first photoresist layer;

forming a second photoresist layer on said substrate, said second photoresist layer exposing said active area in a second direction orthogonal to said first direction;

implanting fourth ions with said conductivity to form a threshold implant region; and removing said second photoresist layer.

8. The method according to claim 7, wherein said first direction comprises a plurality of word-line devices formed therein.

9. The method according to claim 7, wherein said second direction comprises a plurality of bit-line devices formed therein.

10. The method according to claim 7, wherein said conductivity is p-type.

* * * * *